United States Patent
Kim (10) Patent No.: US 6,680,651 B2
(45) Date of Patent: Jan. 20, 2004

(54) CURRENT MIRROR AND DIFFERENTIAL AMPLIFIER FOR PROVIDING LARGE CURRENT RATIO AND HIGH OUTPUT IMPEDENCE

(75) Inventor: Hyun-seok Kim, Kwacheon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/133,777

(22) Filed: Apr. 26, 2002

(65) Prior Publication Data

US 2003/0030492 A1 Feb. 13, 2003

(30) Foreign Application Priority Data

Jul. 13, 2001 (KR) ........................................ 2001-42354

(51) Int. Cl.[7] ................................................. H03F 3/04
(52) U.S. Cl. ...................... 330/288; 330/257; 330/289; 327/362; 323/315
(58) Field of Search ................................ 330/256, 257, 330/288, 289; 327/362; 323/315, 316

(56) References Cited

U.S. PATENT DOCUMENTS

| | | | |
|---|---|---|---|
| 4,471,292 A | | 9/1984 | Schenck et al. ............. 323/315 |
| 4,475,077 A | * | 10/1984 | Nagano ....................... 323/312 |
| 4,475,087 A | * | 10/1984 | Nagano ....................... 330/288 |
| 4,604,586 A | * | 8/1986 | Rinderle ...................... 330/288 |
| 4,855,618 A | | 8/1989 | Brokaw ..................... 307/296.6 |
| 4,888,563 A | * | 12/1989 | Stefani ........................ 330/296 |
| 5,444,363 A | | 8/1995 | Cabler ......................... 323/315 |
| 5,448,158 A | | 9/1995 | Ryat ............................. 323/315 |
| 5,481,180 A | | 1/1996 | Ryat ............................. 323/315 |
| 5,485,074 A | | 1/1996 | Tomasini et al. ............. 323/315 |
| 5,774,013 A | | 6/1998 | Groe ............................ 327/543 |
| 5,900,773 A | | 5/1999 | Susak ........................... 327/539 |
| 5,929,622 A | | 7/1999 | Kardash ....................... 323/315 |
| 6,075,355 A | | 6/2000 | Filoramo et al. ............ 323/315 |

FOREIGN PATENT DOCUMENTS

| | | |
|---|---|---|
| JP | 8321732 | 12/1996 |
| JP | 10-260746 | 9/1998 |
| WO | WO 00/30251 | 5/2000 |

OTHER PUBLICATIONS

Durec, Jeff, *An Integrated Silicon Bipolar Receiver Subsystem for 900–MHz ISM Band Applications*, IEEE, vol. 33, No. 9, Sep. 1998, pp. 1352–1372.

* cited by examiner

*Primary Examiner*—Henry Choe
(74) *Attorney, Agent, or Firm*—F. Chau & Associates, LLP

(57) ABSTRACT

A current mirror for providing a large current ratio and a high output impedance even in radio frequency operation and a differential amplifier including the same are provided. The current mirror includes a current source for supplying a reference current, a reference transistor, an output transistor, and a proportional-to-absolute temperature (PTAT) voltage generator. The current source has a first terminal connected to a first reference voltage and a second terminal. The reference transistor has a control electrode, a first current carrying electrode connected to the second terminal of the current source, and a second current carrying electrode connected to a second reference voltage. The output transistor has a control electrode, a first current carrying electrode connected to an output terminal to which a mirrored current flows, and a second current carrying electrode connected to the second reference voltage. The PTAT voltage generator is connected between the control electrode of the reference transistor and the control electrode of the output transistor, for increasing the voltage of the control electrode of the reference transistor to a predetermined voltage and supplying the increased voltage to the control electrode of the output transistor.

21 Claims, 6 Drawing Sheets

CURRENT MIRROR AND DIFFERENTIAL AMPLIFIER FOR PROVIDING LARGE CURRENT RATIO AND HIGH OUTPUT IMPEDENCE

BACKGROUND OF THE INVENTION

1. Field of the Invention

The present invention relates to semiconductor integrated circuits and, more particularly, to a current mirror for providing a large current ratio and a high output impedance and a differential amplifier having the same.

2. Description of the Related Art

A current mirror is a circuit for mirroring an amount of current flow of one circuit branch into another circuit branch. The current mirror serves as a constant current source for supplying a predetermined amount of current regardless of load and is generally used to set a DC bias of a circuit.

Figure 1:
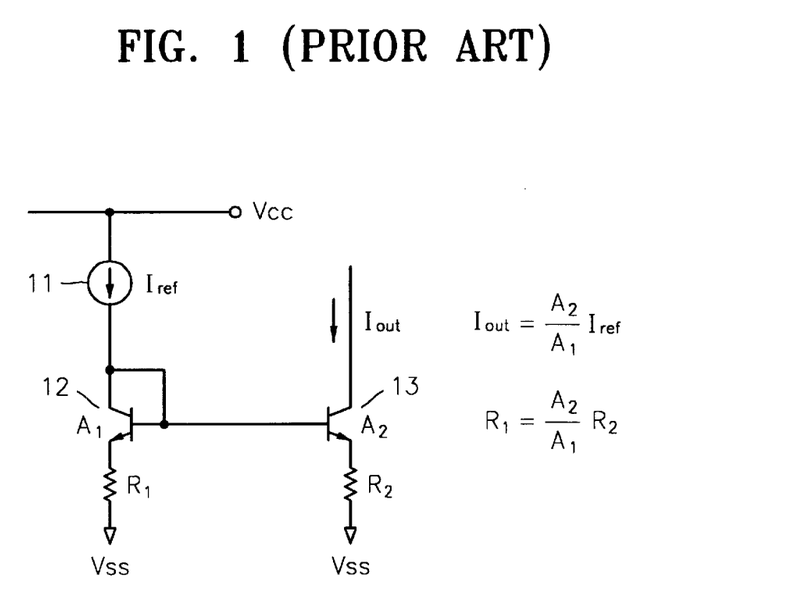
FIG. 1 is a circuit diagram of a conventional current mirror.

FIG. 1 is a circuit diagram of a conventional current mirror. Referring to FIG. 1, an output current $I_{out}$, for example, a mirrored current, is obtained by multiplying the ratio of a size $A_2$ of an output transistor 13 to a size $A_1$ of a reference transistor 12 with a reference current $I_{ref}$. However, to reduce current consumption in a radio frequency (RF) circuit, in general, current smaller than 100 $\mu A$ is used as the reference current $I_{ref}$, the output current $I_{out}$ must be greater than 1 mA to be used as a bias current. Thus, in a case where the size $A_1$ of the reference transistor 12 is 1, the size $A_2$ of the output transistor 13 must be greater than 10.

In this case, an output impedance of the current mirror in low frequency operation relates only to the amount of the output current $I_{out}$ ($V_e/I_{out}$) ($V_e$ is early voltage), and does not relate to the size $A_2$ of the output transistor 13. However, parasitic components, for example, parasitic capacitance between a base and a collector of the output transistor 13 and parasitic capacitance between a substrate and a collector, occur in radio frequency operation, thereby lowering the output impedance of the current mirror. And the parasitic components are increased as the size $A_2$ of the output transistor 13 increases.

A current mirror is generally used as a current source of a differential amplifier. If an output impedance of the current mirror decreases, a common mode rejection ratio (CMRR) of the differential amplifier is lowered, and thus precise differential signals are not generated. Further, a differential amplifier in which one terminal is grounded, is used as an active balun in a local oscillator (LO) of a RF mixer. However, the CMRR of the differential amplifier used in the LO of the RF mixer is low and precise differential signals are not generated, the characteristics of the mixer are greatly lowered. Accordingly, a need exists for a current mirror for providing a large current ratio and a high output impedance even in radio frequency operation and a differential amplifier for generating precise differential signals without lowering a common mode rejection ratio (CMRR).

SUMMARY OF THE INVENTION

A current mirror is provided, which includes: a current source for supplying a reference current, the current source having a first terminal connected to a first reference voltage and a second terminal; a reference transistor having a control electrode, a first current carrying electrode connected to the second terminal of the current source, and a second current carrying electrode connected to a second reference voltage; an output transistor having a control electrode, a first current carrying electrode connected to an output terminal to which a mirrored current flows, and a second current carrying electrode connected to the second reference voltage; and a proportional-to-absolute temperature (PTAT) voltage generator connected between the control electrode of the reference transistor and the control electrode of the output transistor, for increasing the voltage of the control electrode of the reference transistor to a predetermined voltage and supplying the increased voltage to the control electrode of the output transistor. The first reference voltage is a supply voltage, and the second reference voltage is a ground voltage.

According to an embodiment of the present invention, the current mirror further includes: a first resistor connected between the second current carrying electrode of the reference transistor and the second reference voltage; and a second resistor connected between the second current carrying electrode of the output transistor and the second reference voltage. The first reference voltage is a supply voltage, and the second reference voltage is a ground voltage. The predetermined voltage is obtained by $$V_t \times \ln\left(\frac{Z \times A_1}{A_2}\right),$$

wherein $V_t$ is a thermal voltage, Z is the resistance ratio of the first resistor to the second resistor, and $A_1$ and $A_2$ are the sizes of emitters of the reference transistor and the output transistor, respectively.

According to an embodiment of the present invention, the PTAT voltage generator includes: a first transistor having a first current carrying electrode connected to the second terminal of the current source, a control electrode connected to the first current carrying electrode, and a second current carrying electrode; a second transistor having a control electrode connected to the control electrode of the first transistor, a first current carrying electrode connected to the first reference voltage, and a second current carrying electrode; a third transistor having a control electrode connected to the second current carrying electrode of the second transistor, a first current carrying electrode connected to the second current carrying electrode of the first transistor, and a second current carrying electrode connected to the first current carrying electrode of the reference transistor; and a fourth transistor having a control electrode connected to the second current carrying electrode of the first transistor, a first current carrying electrode connected to the second current carrying electrode of the second transistor, and a second current carrying electrode connected to the control electrode of the output transistor. The first through fourth transistors of the PTAT voltage generator are bipolar transistors.

According to an embodiment of the present invention, the PTAT voltage generator includes: a first transistor having a first current carrying electrode connected to the first reference voltage, a control electrode, and a second current carrying electrode; a second transistor having a control electrode connected to the control electrode of the first transistor, a first current carrying electrode connected to the first reference voltage, and a second current carrying electrode connected to its control electrode; a third transistor having a control electrode connected to the second current carrying electrode of the first transistor, a first current carrying electrode connected to the second current carrying electrode of the first transistor, and a second current carrying electrode connected to the first current carrying electrode of the reference transistor; and a fourth transistor having a control electrode connected to the control electrode of the third transistor, a first current carrying electrode connected to the second current carrying electrode of the second transistor, and a second current carrying electrode connected to the control electrode of the output transistor. The first and second transistors are MOS transistors, and the third and fourth transistors are bipolar transistors.

According to an embodiment of the present invention, the reference transistor and the output transistor are bipolar transistors.

A differential amplifier is also provided, which includes: a differential amplifying unit for differentially amplifying two input signals; and a current mirror for generating a mirrored current proportional to a predetermined reference current and supplying the mirrored current as a current source to the differential amplifying unit, wherein the current mirror includes: a current source for supplying a reference current, the current source having a first terminal connected to a first reference voltage and a second terminal; a reference transistor having a control electrode, a first current carrying electrode connected to the second terminal of the current source, and a second current carrying electrode connected to a second reference voltage; an output transistor having a control electrode, a first current carrying electrode connected to an output terminal to which a mirrored current flows, and a second current carrying electrode connected to the second reference voltage; and a proportional-to-absolute temperature (PTAT) voltage generator connected between the control electrode of the reference transistor and the control electrode of the output transistor, for increasing the voltage of the control electrode of the reference transistor to a predetermined voltage and supplying the increased voltage to the control electrode of the output transistor.

According to an embodiment of the present invention, the current mirror includes: a first resistor, the first resister having a first terminal connected to the second current carrying electrode of the reference transistor and a second terminal connected to the second reference voltage; and a second resistor, the second resister having a first terminal connected to the second current carrying electrode of the output transistor and a second terminal connected to the second reference voltage. The first reference voltage is a supply voltage, and the second reference voltage is a ground voltage. The predetermined voltage is obtained by $$V_t \times \ln\left(\frac{Z \times A_1}{A_2}\right),$$

wherein $V_t$ is a thermal voltage, Z is the resistance ratio of the first resistor to the second resistor, and $A_1$ and $A_2$ are the sizes of emitters of the reference transistor and the output transistor, respectively.

According to an embodiment of the present invention, the PTAT voltage generator includes: a first transistor having a first current carrying electrode connected to the second terminal of the current source, a control electrode connected to the first current carrying electrode, and a second current carrying electrode; a second transistor having a control electrode connected to the control electrode of the first transistor, a first current carrying electrode connected to the first reference voltage, and a second current carrying electrode; a third transistor having a control electrode connected to the second current carrying electrode of the second transistor, a first current carrying electrode connected to the second current carrying electrode of the first transistor, and a second current carrying electrode connected to the first current carrying electrode of the reference transistor; and a fourth transistor having a control electrode connected to the control electrode of the third transistor, a first current carrying electrode connected to the second current carrying electrode of the second transistor, and a second current carrying electrode connected to the control electrode of the output transistor. The first through fourth transistors are bipolar transistors.

According to an embodiment of the present invention, the PTAT voltage generator includes: a first transistor having a first current carrying electrode connected to the first reference voltage, a control electrode, and a second current carrying electrode; a second transistor having a control electrode connected to the control electrode of the first transistor, a first current carrying electrode connected to the first reference voltage, and a second current carrying electrode connected to its control electrode; a third transistor having a control electrode connected to the second current carrying electrode of the first transistor, a first current carrying electrode connected to the second current carrying electrode of the first transistor, and a second current carrying electrode connected to the first current carrying electrode of the reference transistor; and a fourth transistor having a control electrode connected to the control electrode of the third transistor, a first current carrying electrode connected to the second current carrying electrode of the second transistor, and a second current carrying electrode connected to the control electrode of the output transistor.

A method for generating a mirrored current is also provided, which includes the steps of: supplying a reference current to a collector of a bipolar reference transistor; increasing a base voltage of the bipolar reference transistor to a predetermined voltage to supply a current having a predetermined proportion to the reference current to generate the mirrored current; and supplying the increased voltage to a base of a bipolar output transistor.

According to an embodiment of the present invention, the predetermined portion is a ratio in size of a plurality of transistors connected to the reference transistor versus a plurality of transistors connected to the output transistor.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Hereinafter, the present invention will be described in detail by describing preferred embodiments of the invention with reference to the accompanying drawings. Like reference numerals refer to like elements throughout the drawings.

Figure 2:
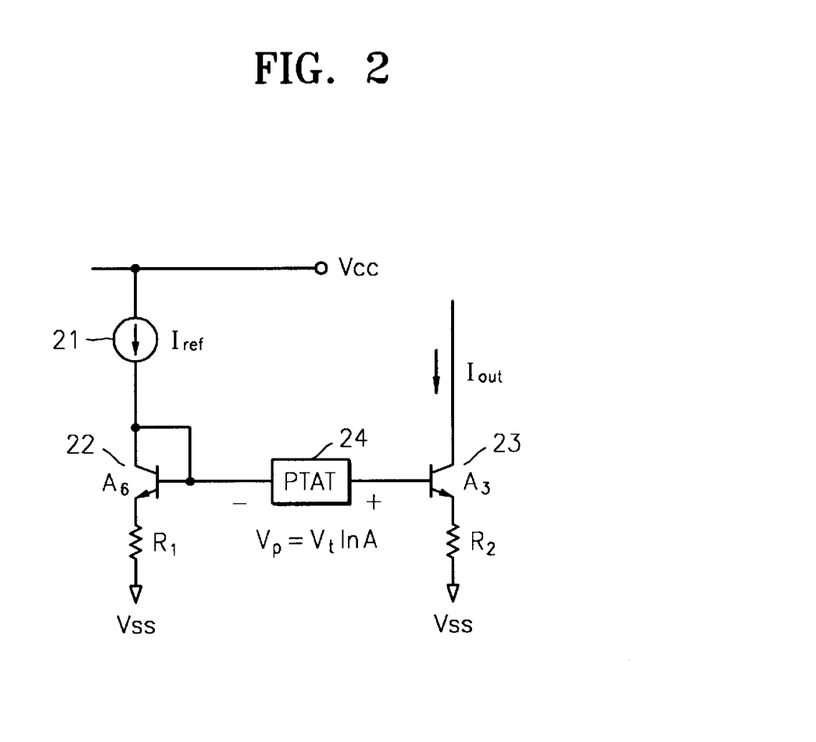
FIG. 2 is a circuit diagram of a current mirror according to an embodiment of the present invention.

FIG. 2 is a circuit diagram of a current mirror according to an embodiment of the present invention. Referring to FIG. 2, the current mirror includes a current source 21, a reference transistor 22, an output transistor 23, and a proportional-to-absolute temperature (PTAT) voltage generator 24.

One terminal of the current source 21 is connected to a first reference voltage, for example, a supply voltage Vcc, and the current source 21 supplies a reference current $I_{ref}$. Each of the reference transistor 22 and the output transistor 23 includes a bipolar transistor having a base corresponding to a control electrode, a collector corresponding to a first current carrying electrode, and an emitter corresponding to a second current carrying electrode.

The collector of the reference transistor 22 is connected to the other terminal of the current source 21, and the base of the reference transistor 22 is connected to the collector. The emitter of the reference transistor 22 is connected to a second reference voltage, for example, directly to a ground voltage Vss or to the ground voltage Vss via a resistor $R_1$.

The collector of the output transistor 23 is connected to an output current $I_{out}$, that is, an output terminal to which a mirrored current flows, and the emitter of the output transistor 23 is connected directly to the ground voltage Vss or to the ground voltage Vss via a resistor $R_2$.

The PTAT voltage generator 24 is connected between the base of the reference transistor 22 and the base of the output transistor 23, increases the voltage of the base of the reference transistor 22 to a predetermined voltage $V_p$, and supplies the increased voltage to the base of the output transistor 23.

Figure 3:
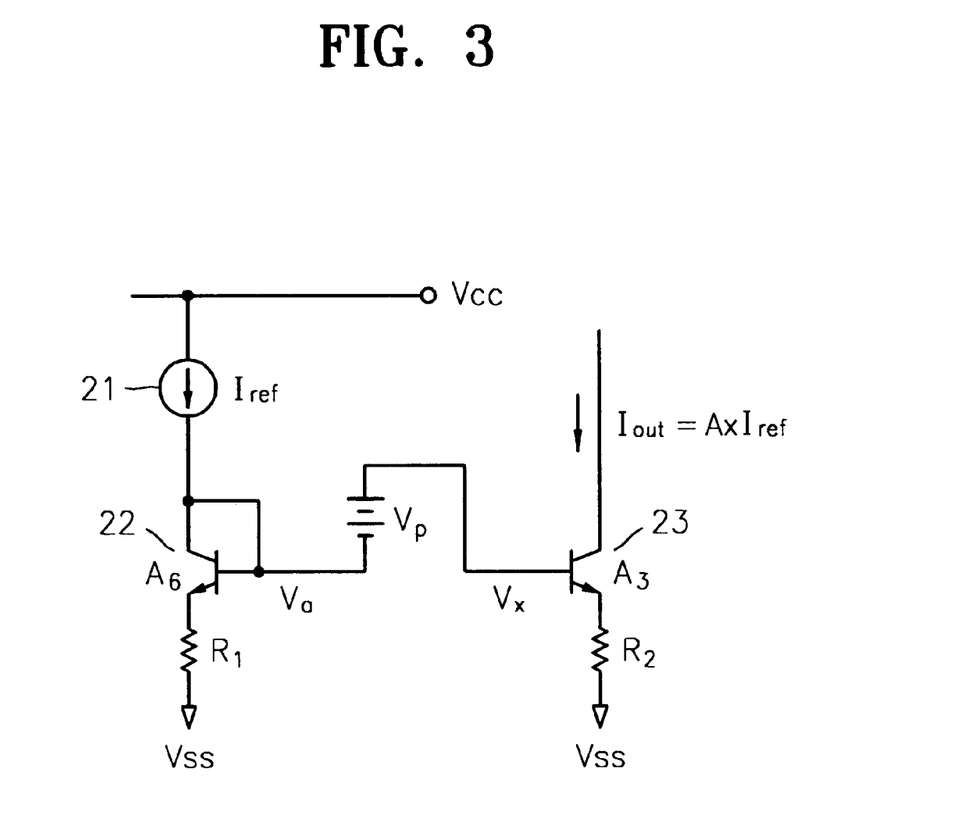
FIG. 3 is an equivalent circuit diagram of the current mirror shown in FIG. 2.

FIG. 3 illustrates the basic principle of the current mirror shown in FIG. 2. The voltage required to obtain the desired target output current $I_{out}$ is derived as described below. First, the reference current $I_{ref}$ flowing to the reference transistor 22 is obtained by Equation 1.

$$Iref = A_6 \times I_s \times \exp\left\{\frac{(Va - Iref \times R_1)}{V_t}\right\} \quad (1)$$

Here, $A_6$ is the size of the reference transistor 22, that is, the area of the emitter, and $V_a$ is the voltage of the base of the reference transistor 22, and $I_s$ is a saturated current, and $V_t$ is a thermal voltage.

Thus, $V_a$ is obtained by Equation 2.

$$V_a = V_t \times \ln\left(\frac{I_{ref}}{A_6 \times I_s}\right) + I_{ref} \times R_1 \quad (2)$$

The output current $I_{out}$ flowing to the output transistor 23 is obtained by Equation 3.

$$I_{out} = A_3 \times I_s \times \exp\left\{\frac{(V_x - I_{out} \times R_2)}{V_t}\right\} \quad (3)$$

Here, $A_3$ is the size of the output transistor 23, that is, the area of the emitter, and $V_x$ is the voltage of the base of the output transistor 23.

Thus, $V_x$ is obtained by Equation 4.

$$V_x = V_t \times \ln\left(\frac{I_{out}}{A_3 \times I_s}\right) + I_{out} \times R_2 \quad (4)$$

Meanwhile, $V_p$ is the difference between $V_x$ and $V_a$ and thus is obtained by Equation 5.

$$V_p = V_t \times \ln\left(\frac{I_{out}}{A_3 \times I_s}\right) + I_{out} \times R_2 - V_t \times \ln\left(\frac{I_{ref}}{A_6 \times I_s}\right) - I_{ref} \times R_1 \quad (5)$$

Here, for simplicity, assuming that $I_{out} \times R_2$ is the same as $I_{ref} \times R_1$ and $R_1/R_2$ is A, Equation 5 can be reduced into Equation 6.

$$V_p = V_t \times \ln\left(\frac{I_{out} \times A_6}{I_{ref} \times A_3}\right) = V_t \times \ln\left(\frac{A \times A_6}{A_3}\right) \quad (6)$$

$V_p$ can be obtained by the PTAT voltage generator 24 having bipolar transistors. $V_p$ is not affected by the supply voltage Vcc but only by an absolute temperature, and thus the output current $I_{out}$ is not affected by the supply voltage Vss but only by the absolute temperature.

Figure 4:
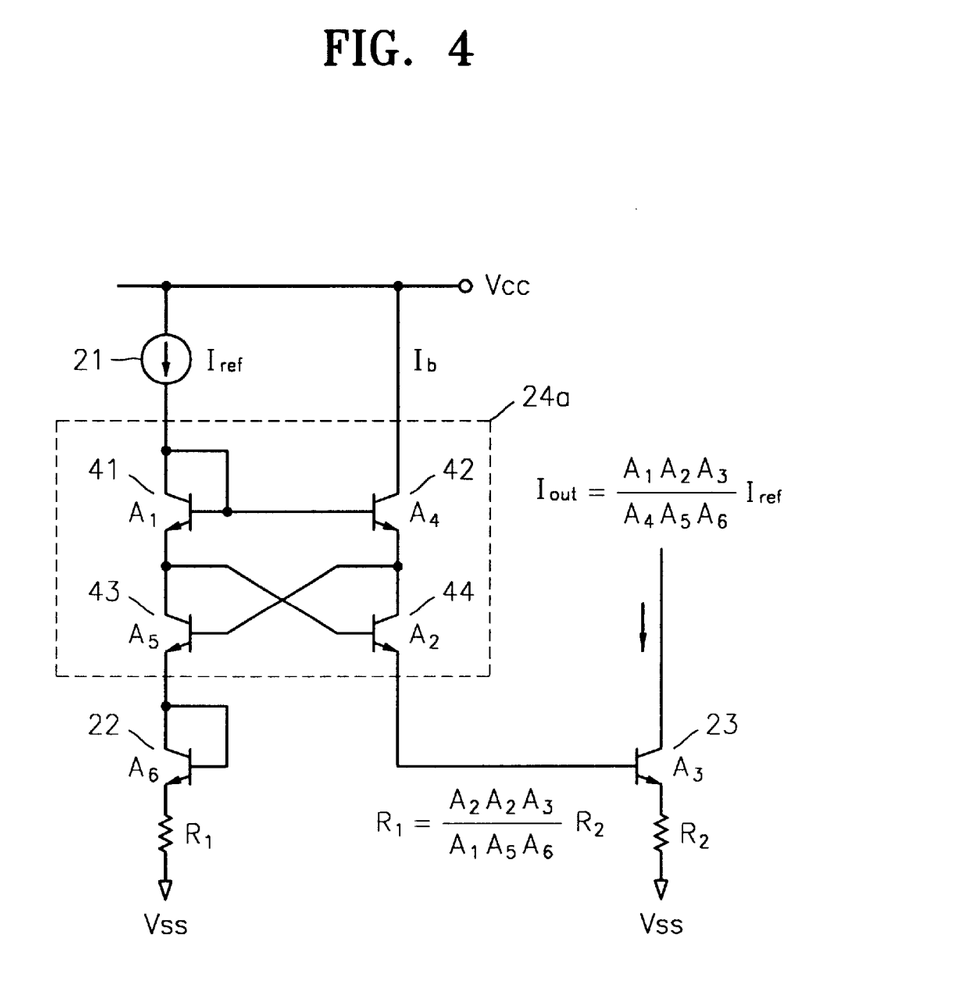
FIG. 4 is a circuit diagram of the current mirror having a proportional-to-absolute temperature (PTAT) voltage generator according to an embodiment of the present invention.

FIG. 4 is a circuit diagram of a current mirror having a proportional-to-absolute temperature (PTAT) voltage generator according to an embodiment of the present invention. Referring to FIG. 4, the current mirror includes a current source 21, a reference transistor 22, an output transistor 23, and a PTAT voltage generator 24a. According to an embodiment of the present invention, the PTAT voltage generator 24a includes a first transistor 41, a second transistor 42, a third transistor 43, and a fourth transistor 44.

One terminal of the current source 21 is connected to a first reference voltage, for example, a supply voltage Vcc, and the current source 21 supplies a reference current $I_{ref}$. Each of the first through fourth transistors 41~44 includes a bipolar transistor having a base corresponding to a control electrode, a collector corresponding to a first current carrying electrode, and an emitter corresponding to a second current carrying electrode.

The collector and base of the first transistor 41 are connected to the other terminal of a current source 21. The collector of the second transistor 42 is connected to the supply voltage Vcc, and the base of the second transistor 42 is connected to the base of the first transistor 41. The collector of the third transistor 43 is connected to the emitter of the first transistor 41, the base of the third transistor 43 is connected to the emitter of the second transistor 42, and the emitter of the third transistor 43 is connected to the collector of the reference transistor 22. The collector of the fourth transistor 44 is connected to the emitter of the second transistor 42, the base of the fourth transistor 44 is connected to the emitter of the first transistor 41, and the emitter of the fourth transistor 44 is connected to the base of the output transistor 23.

The following Equation 7 is formulated for the circuit shown in FIG. 4.

$$V_{be}(41)+V_{be}(44)+V_{be}(23)+I_{out} \times R_2 = V_{be}(42)+V_{be}(43)+V_{be}(22)+I_{ref} \times R_1 \quad (7)$$

Here, $V_{be}(41)$ is the voltage between the base and emitter of the first transistor 41, $V_{be}(42)$ is the voltage between the base and emitter of the fourth transistor 44, and $V_{be}(23)$ is the voltage between the base and emitter of the output transistor 23. Further, $V_{be}(42)$ is the voltage between the base and emitter of the second transistor 42, $V_{be}(43)$ is the voltage between the base and emitter of the third transistor 43, and $V_{be}(22)$ is the voltage between the base and emitter of the reference transistor 22.

Equation 7 can be expressed by Equation 8.

$$V_t \times \ln\left(\frac{A_4 \times A_5}{A_1 \times A_2}\right) = V_t \times \ln\left(\frac{I_{ref} \times A_3}{I_{out} \times A_6}\right) + I_{out} \times R_2 - I_{ref} \times R_1 \quad (8)$$

Here, $A_1$ is the size of the first transistor 41, that is, the area of the emitter, and $A_4$ is the area of the emitter of the second transistor 42. $A_5$ is the area of the emitter of the third transistor 43, and $A_2$ is the area of the emitter of the fourth transistor 44. Further, $A_6$ is the area of the emitter of the reference transistor 22, and $A_3$ is the area of the emitter of the output transistor 23.

Meanwhile, the relation of $R_1$ and $R_2$ is expressed by Equation 9.

$$R_1 = \left(\frac{A_1 \times A_2 \times A_3}{A_4 \times A_5 \times A_6}\right) \times R_2 \quad (9)$$

If Equation 9 is substituted into Equation 8, Equation 10 is obtained.

$$V_t \times \ln\left(\frac{A_4 \times A_5 \times A_6}{A_1 \times A_2 \times A_3}\right) = V_t \times \ln\left(\frac{I_{ref}}{I_{out}}\right) \quad (10)$$

Thus, from Equation 10, the output current $I_{out}$ can be expressed by Equation 11.

$$I_{out} = \left(\frac{A_1 \times A_2 \times A_3}{A_4 \times A_5 \times A_6}\right) \times I_{ref} \quad (11)$$

As a consequence, the output current $I_{out}$ in the current mirror shown in FIG. 4 according to the present invention is proportional to the reference current $I_{ref}$. Further, as shown in Equation 11, even if the size $A_3$ of the output transistor 23 is reduced to about 1 to about 2 when the size $A_6$ of the reference transistor 22 is about 1, the size $A_1$ of the first transistor 41 and the size $A_2$ of the fourth transistor 44 can be increased to obtain a large current ratio.

In other words, in the current mirror according to the present invention, to reduce parasitic components, the size $A_3$ of the output transistor 23 can be small, and simultaneously, a large current ratio can be obtained. Thus, the current mirror according to the present invention can have a high output impedance even in radio frequency operation.

Figure 5:
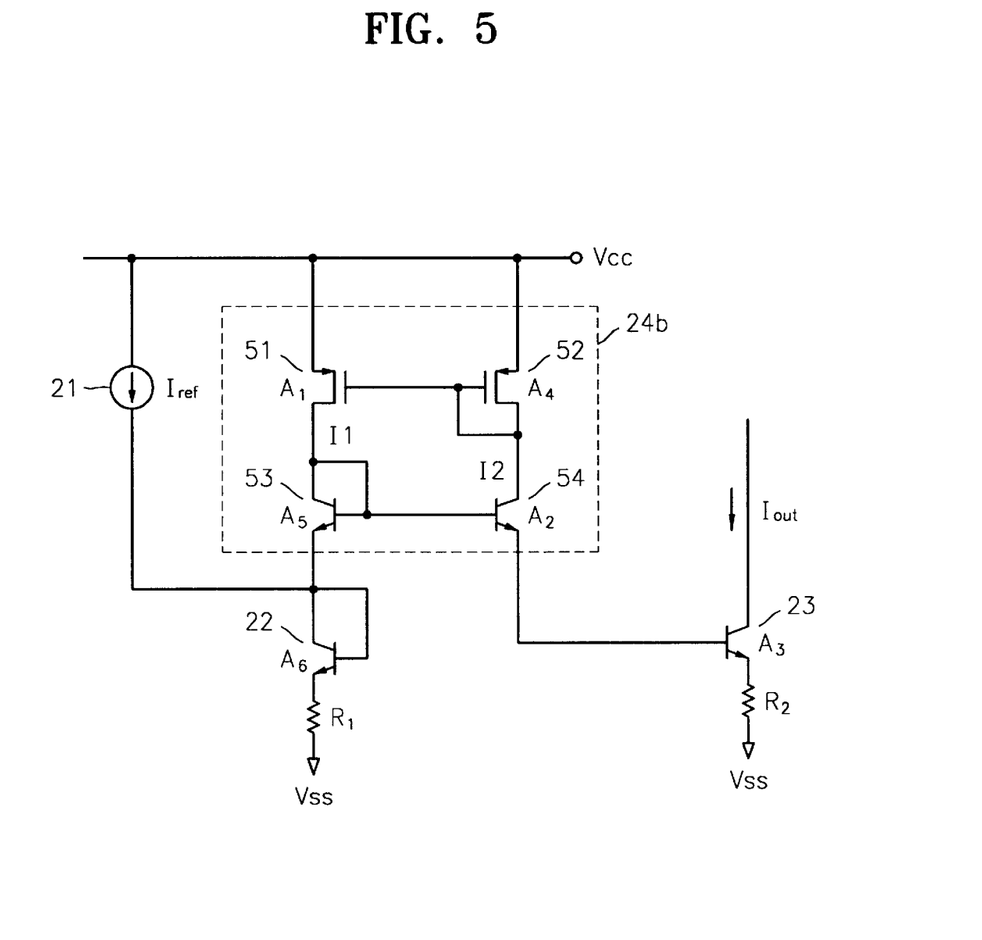
FIG. 5 is a circuit diagram of a current mirror having a PTAT voltage generator according to another embodiment of the present invention.

FIG. 5 is a circuit diagram of a current mirror having a PTAT voltage generator according to another embodiment of the present invention. Referring to FIG. 5, the current mirror includes a current source 21, a reference transistor 22, an output transistor 23, and a PTAT voltage generator 24b. The PTAT voltage generator 24b includes a first transistor 51, a second transistor 52, a third transistor 53, and a fourth transistor 54.

Each of the first and second transistors 51 and 52 includes a PMOS transistor having a gate corresponding to a control electrode, a source corresponding to a first current carrying electrode, and a drain corresponding to a second current carrying electrode. Each of the third and fourth transistors 53 and 54 includes a bipolar transistor having a base corresponding to a control electrode, a collector corresponding to a first current carrying electrode, and an emitter corresponding to a second current carrying electrode Sources of the first and second transistors 51 and 52 are connected to a supply voltage Vcc, and the gate of the first transistor 51 and the gate and drain of the second transistor 52 are connected to one another. The collector and base of the third transistor 53 are connected to the drain of the first transistor 51, and the emitter of the third transistor 53 is connected to the collector of the reference transistor 22. The collector of the fourth transistor 54 is connected to the drain of the second transistor 52, the base of the fourth transistor 54 is connected to the base of the third transistor 53, and the emitter of the fourth transistor 54 is connected to the base of the output transistor 23.

The circuit shown in FIG. 5 performs similar operations to the circuit shown in FIG. 4, and thus detailed descriptions thereof are omitted. The output current $I_{out}$ expressed by Equation 11 is similarly applied to the circuit shown in FIG. 4.

Meanwhile, in the circuit shown in FIG. 5, a reference current flowing to the reference transistor 22 is $I_{ref}+I1$. Here, $I_{ref}$ indicates a current from the current source 21 and I1 indicates a current from the first transistor 51. However, in a case where the size $A_1$ of the first transistor 51 is the same as or smaller than the size $A_4$ of the second transistor 52, the current I1 is increased excessively, and thus the reference current deviates from $I_{ref}$. As a result, Equation 11 is not the proper representation of the output current $I_{out}$ for the circuit shown in FIG. 5. Thus, in the circuit shown in FIG. 5, to reduce the effect of the current I1 on the reference current, the size $A_4$ of the second transistor 52 is preferably greater than the size $A_1$ of the first transistor 51.

Figure 6:
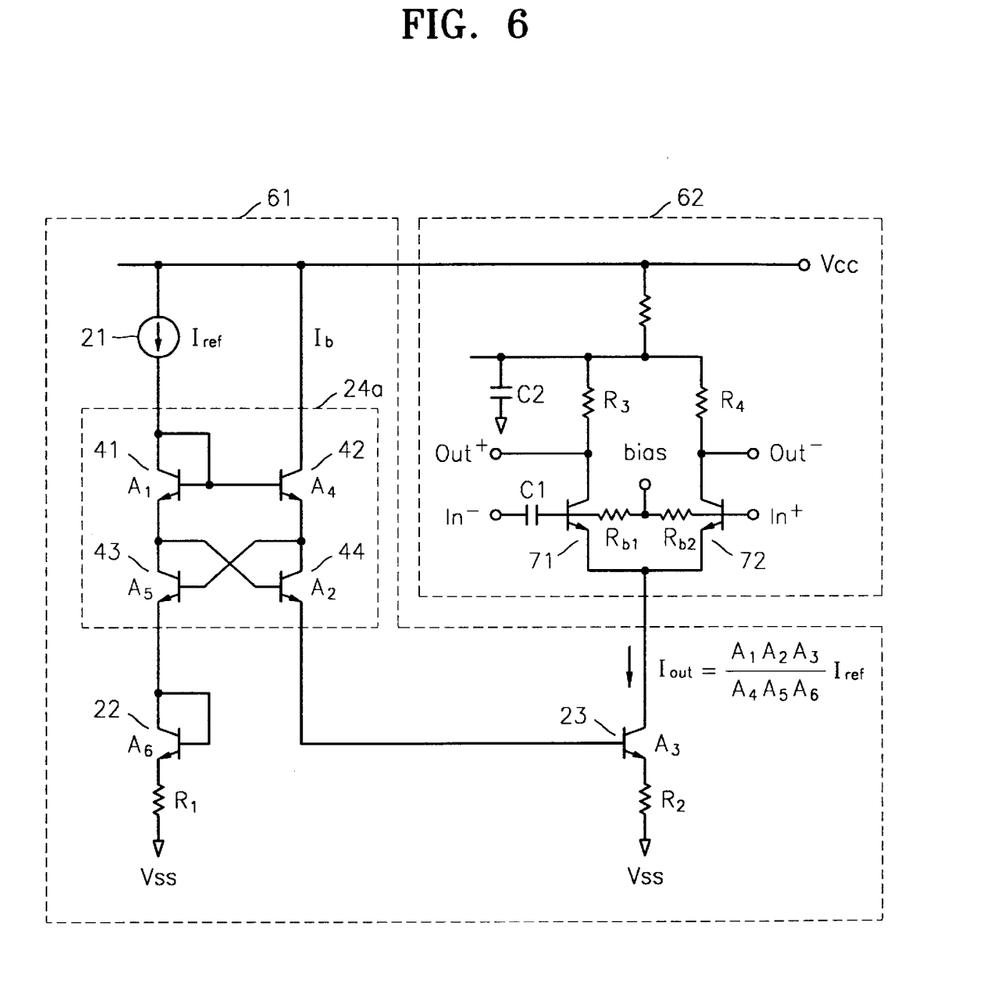
FIG. 6 is a circuit diagram of a differential amplifier using the current mirror shown in FIG. 4.

FIG. 6 is a circuit diagram of a differential amplifier using the current mirror shown in FIG. 4. Referring to FIG. 6, a differential amplifier according to the present invention includes a differential amplifying unit 62 for differentially amplifying two input signals In− and In+, and a current mirror 61 for supplying an output current $I_{out}$ as a current source of the differential amplifying unit 62. The current mirror 61 generates a mirrored current proportional to a reference current $I_{ref}$, that is, the output current $I_{out}$, and supplies the output current $I_{out}$ as a current source of the differential amplifying unit 62. In particular, the current mirror 61 has the same structure as the current mirror shown in FIG. 4, and has similar structure as the current mirror shown in FIG. 5. Accordingly, the current mirror 61 has a high output impedance.

The differential amplifying unit 62 can be a conventional differential amplifying circuit known to one skilled in the art and can have various configurations, and thus detailed descriptions of the operation thereof are omitted. Reference symbols $R_3$, $R_4$, $R_{b1}$, and $R_{b2}$ denote resistor components, and reference symbols $C_1$ and $C_2$ denote capacitors. Transistors 71 and 72 are differential transistor pairs and include bipolar transistors.

Thus, in the differential amplifier shown in FIG. 6, the output impedance of the current mirror 61 is high, the common mode rejection ratio (CMRR) of the differential amplifier is not lowered, and precise differential signals can be generated.

Figure 7:
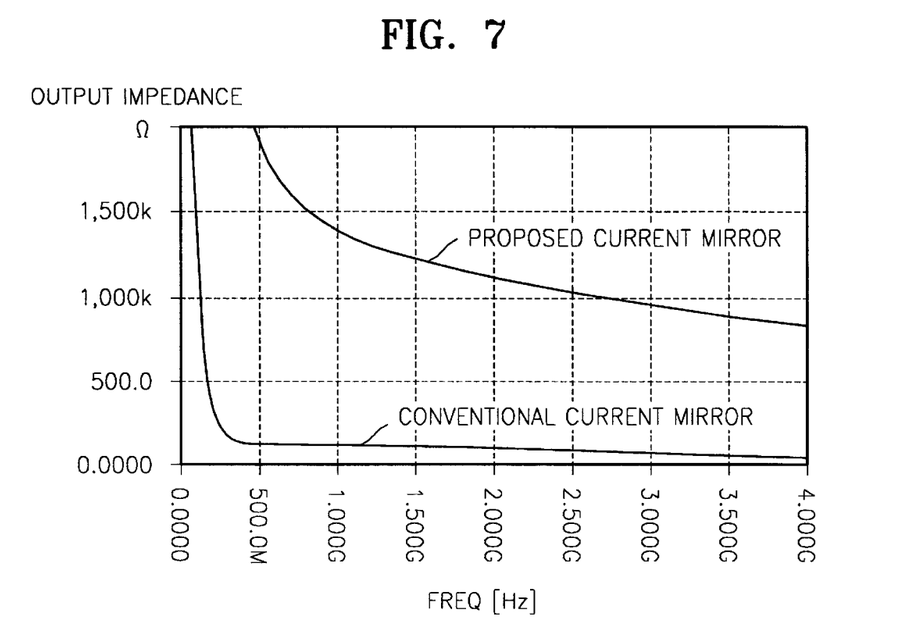
FIG. 7 is a graph comparing the output impedance of the conventional current mirror shown in FIG. 1 with that of the current mirror shown in FIG. 4.
Figure 8:
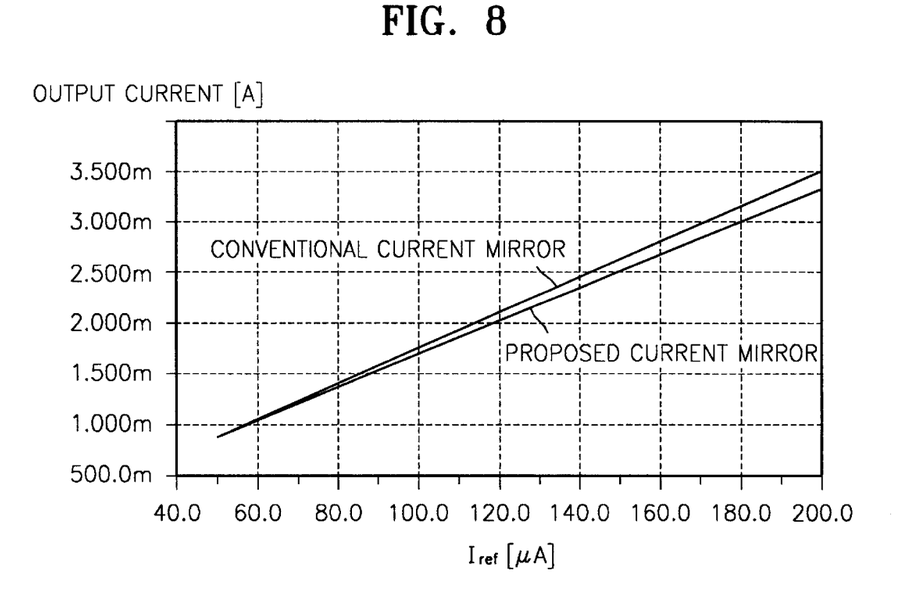
FIG. 8 is a graph comparing the output current of the conventional current mirror shown in FIG. 1 with that of the current mirror shown in FIG. 4.

FIG. 7 is a graph comparing an output impedance of the conventional current mirror shown in FIG. 1 with that of the current mirror shown in FIG. 4. FIG. 8 is a graph comparing an output current of the conventional current mirror shown in FIG. 1 with that of the current mirror shown in FIG. 4.

As shown in FIG. 8, output currents of the conventional current mirror and the current mirror according to the present invention are similar, but as shown in FIG. 7, the output impedance of the current mirror according to the present invention is much higher than the output impedance of the conventional current mirror.

As described above, in the current mirror and a method for generating a mirrored current according to the present invention, a high output impedance can be obtained even in radio frequency operation, and a large current ratio can be provided. Further, in the differential amplifier using the current mirror according to the present invention, the CMMR is not lowered, and precise differential signals are generated. Thus, in a case where the differential amplifier according to the present invention is used in a local oscillator (LO) of a RF mixer, the characteristics of the mixer is improved.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A current mirror comprising:
   a current source for supplying a reference current, the current source having a first terminal connected to a first reference voltage and a second terminal;
   a reference transistor having a control electrode, a first current carrying electrode connected to the second terminal of the current source, and a second current carrying electrode connected to a second reference voltage;
   an output transistor having a control electrode, a first current carrying electrode connected to an output terminal to which a mirrored current flows, and a second current carrying electrode connected to the second reference voltage; and
   a proportional-to-absolute temperature (PTAT) voltage generator comprising at most four transistors connected between the control electrode of the reference transistor and the control electrode of the output transistor, for increasing the voltage of the control electrode of the reference transistor to a predetermined voltage and supplying the increased voltage to the control electrode of the output transistor.

2. The current mirror as claimed in claim 1, wherein the first reference voltage is a supply voltage, and the second reference voltage is a ground voltage.

3. The current mirror as claimed in claim 1 further comprising:
   a first resistor connected between the second current carrying electrode of the reference transistor and the second reference voltage; and
   a second resistor connected between the second current carrying electrode of the output transistor and the second reference voltage.

4. The current mirror as claimed in claim 3, wherein the first reference voltage is a supply voltage, and the second reference voltage is a ground voltage.

5. The current mirror as claimed in claim 3, wherein the predetermined voltage is obtained by $$V_t \times \ln\left(\frac{Z \times A_1}{A_2}\right),$$

wherein $V_t$ is a thermal voltage, Z is the resistance ratio of the first resistor to the second resistor, and $A_1$ and $A_2$ are the sizes of emitters of the reference transistor and the output transistor, respectively.

6. A current mirror comprising:
   a current source for supplying a reference current, the current source having a first terminal connected to a first reference voltage and a second terminal;
   a reference transistor having a control electrode, a first current carrying electrode connected to the second terminal of the current source, and a second current carrying electrode connected to a second reference voltage;
   an output transistor having a control electrode, a first current carrying electrode connected to an output terminal to which a mirrored current flows, and a second current carrying electrode connected to the second reference voltage; and
   a proportional-to-absolute temperature (PTAT) voltage generator connected between the control electrode of the reference transistor and the control electrode of the output transistor, for increasing the voltage of the control electrode of the reference transistor to a predetermined voltage and supplying the increased voltage to the control electrode of the output transistor, wherein the PTAT voltage generator comprises:
   a first transistor having a first current carrying electrode connected to the second terminal of the current source, a control electrode connected to the first current carrying electrode, and a second current carrying electrode;
   a second transistor having a control electrode connected to the control electrode of the first transistor, a first current carrying electrode connected to the first reference voltage, and a second current carrying electrode;
   a third transistor having a control electrode connected to the second current carrying electrode of the second transistor, a first current carrying electrode connected to the second current carrying electrode of the first transistor, and a second current carrying electrode connected to the first current carrying electrode of the reference transistor; and
   a fourth transistor having a control electrode connected to the second current carrying electrode of the first transistor, a first current carrying electrode connected to the second current carrying electrode of the second transistor, and a second current carrying electrode connected to the control electrode of the output transistor.

7. The current mirror as claimed in claim 6, wherein the first through fourth transistors of the PTAT voltage generator are bipolar transistors.

8. A current mirror comprising:
   a current source for supplying a reference current, the current source having a first terminal connected to a first reference voltage and a second terminal;
   a reference transistor having a control electrode, a first current carrying electrode connected to the second terminal of the current source, and a second current carrying electrode connected to a second reference voltage;
   an output transistor having a control electrode, a first current carrying electrode connected to an output terminal to which a mirrored current flows, and a second current carrying electrode connected to the second reference voltage; and
   a proportional-to-absolute temperature (PTAT) voltage generator connected between the control electrode of the reference transistor and the control electrode of the output transistor, for increasing the voltage of the control electrode of the reference transistor to a predetermined voltage and supplying the increased voltage to the control electrode of the output transistor, wherein the PTAT voltage generator comprises:
   a first transistor having a first current carrying electrode connected to the first reference voltage, a control electrode, and a second current carrying electrode;

a second transistor having a control electrode connected to the control electrode of the first transistor, a first current carrying electrode connected to the first reference voltage, and a second current carrying electrode connected to its control electrode;

a third transistor having a control electrode connected to the second current carrying electrode of the first transistor, a first current carrying electrode connected to the second current carrying electrode of the first transistor, and a second current carrying electrode connected to the first current carrying electrode of the reference transistor; and a fourth transistor having a control electrode connected to the control electrode of the third transistor, a first current carrying electrode connected to the second current carrying electrode of the second transistor, and a second current carrying electrode connected to the control electrode of the output transistor.

9. The current mirror as claimed in claim 8, wherein the first and second transistors are MOS transistors, and the third and fourth transistors are bipolar transistors.

10. The current mirror as claimed in claim 1, wherein the reference transistor and the output transistor are bipolar transistors.

11. A differential amplifier comprising a current mirror as defined in claim 1, and:

a differential amplifying unit for differentially amplifying two input signals;

in signal communication with the current mirror for generating a mirrored current proportional to a predetermined reference current and supplying the mirrored current as a current source to the differential amplifying unit.

12. The differential amplifier as claimed in claim 11, wherein the first reference voltage is a supply voltage, and the second reference voltage is a ground voltage.

13. The differential amplifier as claimed in claim 11, wherein the current mirror comprises:

a first resistor, the first resister having a first terminal connected to the second current carrying electrode of the reference transistor and a second terminal connected to the second reference voltage; and a second resistor, the second resister having a first terminal connected to the second current carrying electrode of the output transistor and a second terminal connected to the second reference voltage.

14. The differential amplifier as claimed in claim 13, wherein the first reference voltage is a supply voltage, and the second reference voltage is a ground voltage.

15. The differential amplifier as claimed in claim 13, wherein the predetermined voltage is obtained by $$V_t \times \ln\left(\frac{Z \times A_1}{A_2}\right),$$

wherein $V_t$ is a thermal voltage, Z is the resistance ratio of the first resistor to the second resistor, and $A_1$ and $A_2$ are the sizes of emitters of the reference transistor and the output transistor, respectively.

16. The differential amplifier as claimed in claim 11, wherein the PTAT voltage generator comprises:

a first transistor having a first current carrying electrode connected to the second terminal of the current source, a control electrode connected to the first current carrying electrode, and a second current carrying electrode;

a second transistor having a control electrode connected to the control electrode of the first transistor, a first current carrying electrode connected to the first reference voltage, and a second current carrying electrode;

a third transistor having a control electrode connected to the second current carrying electrode of the second transistor, a first current carrying electrode connected to the second current carrying electrode of the first transistor, and a second current carrying electrode connected to the first current carrying electrode of the reference transistor; and a fourth transistor having a control electrode connected to the second current carrying electrode of the first transistor, a first current carrying electrode connected to the second current carrying electrode of the second transistor, and a second current carrying electrode connected to the control electrode of the output transistor.

17. The differential amplifier as claimed in claim 16, wherein the first through fourth transistors are bipolar transistors.

18. The differential amplifier as claimed in claim 11, wherein the PTAT voltage generator comprises:

a first transistor having a first current carrying electrode connected to the first reference voltage, a control electrode, and a second current carrying electrode;

a second transistor having a control electrode connected to the control electrode of the first transistor, a first current carrying electrode connected to the first reference voltage, and a second current carrying electrode connected to its control electrode;

a third transistor having a control electrode connected to the second current carrying electrode of the first transistor, a first current carrying electrode connected to the second current carrying electrode of the first transistor, and a second current carrying electrode connected to the first current carrying electrode of the reference transistor; and a fourth transistor having a control electrode connected to the control electrode of the third transistor, a first current carrying electrode connected to the second current carrying electrode of the second transistor, and a second current carrying electrode connected to the control electrode of the output transistor.

19. The differential amplifier as claimed in claim 18, wherein the first and second transistors are MOS transistors, and the third and fourth transistors are bipolar transistors.

20. The differential amplifier as claimed in claim 11, wherein the reference transistor and the output transistor are bipolar transistors.

21. A method for generating a mirrored current, the method comprising the steps of:

supplying a reference current to a collector of a bipolar reference transistor;

increasing a base voltage of the bipolar reference transistor to a predetermined voltage to supply a current having a predetermined proportion to the reference current to generate the mirrored current, wherein the predetermined proportion is a ratio in size of a plurality of at most four transistors connected to the reference transistor versus a plurality of at most four transistors connected to the output transistor; and supplying the increased voltage to a base of a bipolar output transistor.

* * * * *